United States Patent
Manassen et al.

(10) Patent No.: US 10,684,563 B2
(45) Date of Patent: Jun. 16, 2020

(54) ON THE FLY TARGET ACQUISITION

(71) Applicant: KLA-TENCOR CORPORATION, Milpitas, CA (US)

(72) Inventors: Amnon Manassen, Haifa (IL); Andrew Hill, Berkeley, CA (US); Nadav Gutman, Zichron Ya'aqov (IL); Yossi Simon, Qiryat Atta (IL); Alexander Novikov, Kiryat Motzkin (IL); Eugene Maslovsky, Haifa (IL)

(73) Assignee: KLA-Tencor Corporation, Milpitas, CA (US)

( * ) Notice: Subject to any disclaimer, the term of this patent is extended or adjusted under 35 U.S.C. 154(b) by 89 days.

(21) Appl. No.: 15/761,830

(22) PCT Filed: Feb. 19, 2018

(86) PCT No.: PCT/US2018/018588
§ 371 (c)(1),
(2) Date: Mar. 21, 2018

(87) PCT Pub. No.: WO2019/143371
PCT Pub. Date: Jul. 25, 2019

(65) Prior Publication Data
US 2019/0228518 A1     Jul. 25, 2019

Related U.S. Application Data

(60) Provisional application No. 62/620,225, filed on Jan. 22, 2018.

(51) Int. Cl.
*G06T 7/00*     (2017.01)
*H04N 5/372*     (2011.01)
(Continued)

(52) U.S. Cl.
CPC ............ *G03F 9/7049* (2013.01); *G01B 11/00* (2013.01); *G03F 7/70616* (2013.01);
(Continued)

(58) Field of Classification Search
None
See application file for complete search history.

(56) References Cited

U.S. PATENT DOCUMENTS

2007/0007429 A1    1/2007   Fairley et al.
2011/0133066 A1    6/2011   Nozoe et al.
(Continued)

FOREIGN PATENT DOCUMENTS

JP      2013072750 A     4/2013

OTHER PUBLICATIONS

ISA/KR, International Search Report and Written Opinion for PCT/US2018/018588 dated Oct. 18, 2018.

*Primary Examiner* — Michelle M Iacoletti
(74) *Attorney, Agent, or Firm* — Hodgson Russ LLP

(57) ABSTRACT

Metrology systems and methods are provided, which derive metrology target position on the wafer and possibly the target focus position during the movement of the wafer on the system's stage. The positioning data is derived before the target arrives its position (on-the-fly), sparing the time required in the prior art for the acquisition stage and increasing the throughput of the systems and methods. The collection channel may be split to provide for an additional moving-imaging channel comprising at least one TDI (time delay and integration) sensor with an associated analysis unit configured to derive wafer surface information, positioning and/or focusing information of the metrology targets with respect to the objective lens, during wafer positioning movements towards the metrology targets. Additional focusing-during-movement module and possibly feedbacking
(Continued)

derived position and/or focus information to the stage may enhance the accuracy of the stopping of the stage.

19 Claims, 4 Drawing Sheets

(51) Int. Cl.
*G06T 7/246* (2017.01)
*G03F 7/20* (2006.01)
*G06T 7/73* (2017.01)
*G03F 9/00* (2006.01)
*G01B 11/00* (2006.01)

(52) U.S. Cl.
CPC ...... *G03F 7/70625* (2013.01); *G03F 7/70633* (2013.01); *G06T 7/0004* (2013.01); *G06T 7/246* (2017.01); *G06T 7/73* (2017.01); *H04N 5/37206* (2013.01); *G06T 2207/30148* (2013.01)

(56) References Cited

U.S. PATENT DOCUMENTS

| | | | |
|---|---|---|---|
| 2013/0044316 A1 | 2/2013 | Gastaldo et al. | |
| 2014/0320836 A1* | 10/2014 | Yamaguchi | G03F 7/70133 355/67 |
| 2015/0370175 A1 | 12/2015 | Nicolaides et al. | |

* cited by examiner

ON THE FLY TARGET ACQUISITION

CROSS REFERENCE TO RELATED APPLICATIONS

This application claims the benefit of U.S. Provisional Patent Application No. 62/620,225 filed on Jan. 22, 2018, which is incorporated herein by reference in its entirety.

BACKGROUND OF THE INVENTION

1. Technical Field

The present invention relates to the field of semiconductor metrology, and more particularly, to target acquisition in the measurement process.

2. Discussion of Related Art

Metrology systems derive high-quality signals from localized targets, requiring the wafer to be stationary for carrying out each measurement and then subsequently moved to the next target. Accordingly, the wafer measurement sequence is characterized by the steps: Move (from target to target), Acquire (precise positioning of the new target) and Measure (collection of information from the new target)—denoted MAM. This sequence requires fast and accurate acceleration and deceleration profiles for the movement between targets, fast and accurate lateral positioning and focusing of the new target, and finally fast collection of the target information. During the Move step, the automated stage translates the wafer from one overlay target to the anticipated position of the next target using position feedback integrated into the stage such as a position measuring interferometer or glass scale encoder. During the Acquire step, the system captures an image with the sensor head, locates the new overlay target within the sensor head field of view, makes a corrective motion in the automated stage to center the new overlay target within the sensor head field of view, captures information about the focus position of the new overlay target, and make a corrective motion in the relative separation between the wafer and the sensor head to bring the new overlay target into focus. During the Measure step, the system collects overlay information from the new overlay target with the sensor head. The sequence largely defines the total throughput of the metrology system, and requirements from metrology system are rising continuously with respect to throughput, increased number of targets and measurement accuracy.

SUMMARY OF THE INVENTION

The following is a simplified summary providing an initial understanding of the invention. The summary does not necessarily identify key elements nor limits the scope of the invention, but merely serves as an introduction to the following description.

One aspect of the present invention provides a method comprising, in a metrology system which measures overlays on multiple targets on a wafer by moving and stopping a stage supporting the wafer between the measurements of successive targets: acquiring a plurality of wafer images during the motion of the stage, deriving wafer surface information from the acquired images, and using the derived wafer surface information to enhance a positional accuracy and/or a focus accuracy of the stopping of the stage.

These, additional, and/or other aspects and/or advantages of the present invention are set forth in the detailed description which follows; possibly inferable from the detailed description; and/or learnable by practice of the present invention.

BRIEF DESCRIPTION OF THE DRAWINGS

For a better understanding of embodiments of the invention and to show how the same may be carried into effect, reference will now be made, purely by way of example, to the accompanying drawings in which like numerals designate corresponding elements or sections throughout.

In the accompanying drawings.

DETAILED DESCRIPTION OF THE INVENTION

Figure 1:
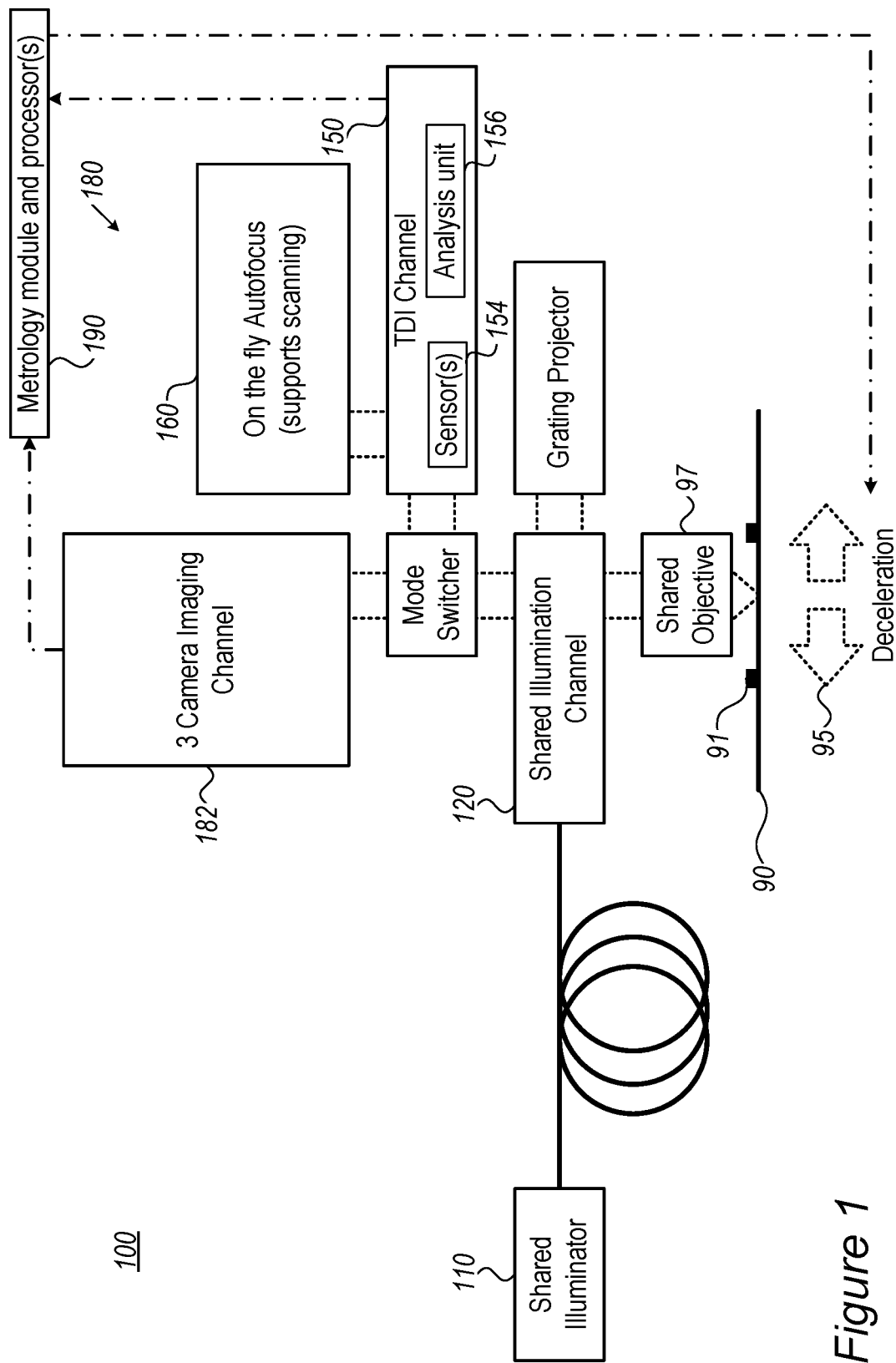
FIGS. 1 and 2 are high-level schematic illustrations of metrology systems, according to some embodiments of the invention.

In the following description, various aspects of the present invention are described. For purposes of explanation, specific configurations and details are set forth in order to provide a thorough understanding of the present invention. However, it will also be apparent to one skilled in the art that the present invention may be practiced without the specific details presented herein. Furthermore, well known features may have been omitted or simplified in order not to obscure the present invention. With specific reference to the drawings, it is stressed that the particulars shown are by way of example and for purposes of illustrative discussion of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

Before at least one embodiment of the invention is explained in detail, it is to be understood that the invention is not limited in its application to the details of construction and the arrangement of the components set forth in the following description or illustrated in the drawings. The invention is applicable to other embodiments that may be practiced or carried out in various ways as well as to combinations of the disclosed embodiments. Also, it is to be understood that the phraseology and terminology employed herein are for the purpose of description and should not be regarded as limiting.

Unless specifically stated otherwise, as apparent from the following discussions, it is appreciated that throughout the specification discussions utilizing terms such as "processing", "computing", "calculating", "determining", "enhancing", "deriving" or the like, refer to the action and/or processes of a computer or computing system, or similar electronic computing device, that manipulates and/or transforms data represented as physical, such as electronic, quantities within the computing system's registers and/or memories into other data similarly represented as physical quantities within the computing system's memories, registers or other such information storage, transmission or display devices.

Certain embodiments provide metrology systems and methods, which derive metrology target position on the wafer and possibly the target focus position during the movement of the wafer on the system's stage (on-the-fly). The positioning data is derived before the target arrives its position, sparing the time required in the prior art for the acquisition stage and increasing the throughput of the systems and methods. The collection channel may be split to provide for an additional moving-imaging channel comprising at least one TDI (time delay and integration) sensor with an associated analysis unit configured to derive at least positioning information of the metrology targets with respect to the objective lens, during wafer positioning movements towards the metrology targets. Additional focusing-during-movement module and possibly feedbacking derived position and/or focus information to the stage may be used to improve target positioning as well, to enhance a positional accuracy and/or a focus accuracy of the stopping of the stage.

Embodiments of the present invention provide efficient and economical methods and mechanisms for acquiring metrology targets during stage movements—on the fly target acquisition—and thereby provide improvements to the technological field of semiconductor metrology. For example, disclosed systems and methods may be applied to overlay metrology to increase the throughput of the overlay metrology system by essentially eliminating the "Acquire" phase of the prior art Move-Acquire-Measure (MAM) sequence, which typically consumes approximately 100 msec—ca. 30% of the total MAM time.

Figure 2:
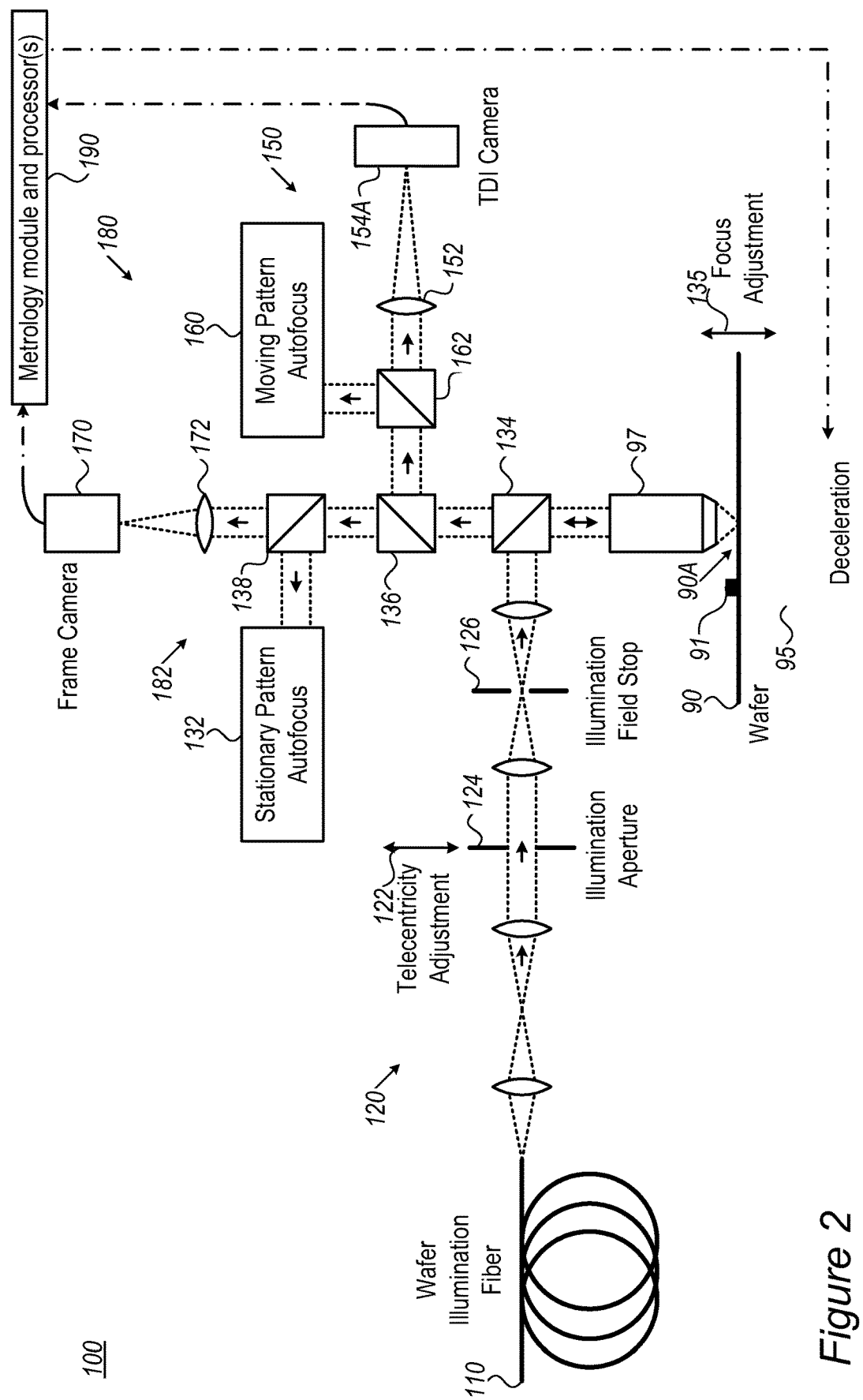

FIGS. 1 and 2 are high-level schematic illustrations of metrology systems 100, according to some embodiments of the invention. Elements from FIGS. 1 and 2 may be combined in any operable combination, and the illustration of certain elements in certain figures and not in others merely serves an explanatory purpose and is non-limiting.

Metrology systems 100 comprise an illumination channel 120 and a collection channel 180 with respect to an objective lens 97 set to image wafer targets 91 on a wafer 90. Metrology systems 100 are configured to derive at least positioning information of metrology targets 91 with respect to objective lens 97, during wafer positioning movements 95 (on-the-fly; typically deceleration, but not limited thereto) towards metrology targets 91, before actually reaching targets 91, and without carrying out prior art target acquisition procedures.

Metrology systems 100 may be configured to enable both the derivation of the positioning information and target measurements once targets 91 are imaged by objective lens 97. Collection channel 180 may be split into a first, stationary-imaging, channel 182 for capturing images of stationary targets 91 (used e.g., for overlay measurements) and a second, moving-imaging channel 150 (on-the-fly imaging-during-movement channel) for capturing images of wafer 90 during wafer motion, e.g., to derive positioning information concerning target 91.

First (stationary-imaging) channel 182 comprises an image sensor 170 configured to derive metrology parameters from corresponding metrology targets 91 on wafer 90, and may further comprise a stationary pattern autofocus module 132 (see FIG. 2). It is noted that stationary pattern autofocus module 132 may be placed to receive light returned from wafer 90, anywhere in system 100, not necessary as part of first channel 182, e.g., possibly in a separate channel (not shown).

Second (moving-imaging) channel 150 may comprise at least one TDI (time delay and integration) sensor 154 with an associated analysis unit 156 (see FIG. 1) configured to derive at least positioning information of metrology targets 91 with respect to objective lens 97, during wafer positioning movements 95 towards metrology targets 91. TDI sensor(s) 154 and analysis unit 156 may be combined into a TDI camera 154A, or at least parts of analysis unit 156 may be implemented separately from TDI camera 154A, e.g., in a metrology module 190 (associated with or comprising processors). It is noted that TDI sensors are configured to accumulate multiple exposures of a relatively-moving object to increase the integration time available to collect the incident light from the object, in a manner which is synchronized with the exposure timing to achieve proper cancelation of the motion effects and sufficient image clarity. In certain embodiments, sensor 154 may comprise a line sensor (or line scan image sensor), which may be operated similar to a one column TDI sensor. A non-limiting example for performance calculation which implies the feasibility of disclosed methods and systems is provided below.

In certain embodiments, illumination channel 120 may be shared for by first (stationary-imaging) channel 182 and second (moving-imaging) channel 150 of collection channel 180, e.g., have a same illuminator 110 (such as a Laser-Sustained Plasma, LSP, coupled to optical fiber(s)) and associated with the same illumination optical path with optical elements (e.g., lenses, aperture(s) 124 with adjustment(s) 122 such as telecentricity adjustment, see below, stop(s) 126 such illumination field stop, etc.). Optical elements 172, 152 (indicated schematically, in a non-limiting manner, in FIG. 2) may be configured to adjust the optical paths in first (stationary-imaging) channel 182 and second (moving-imaging) channel 150, respectively.

In certain embodiments, collection channel 180 may comprise at least one beam splitter 136 configured to split collection channel 180 into first (stationary-imaging) channel 182 and second (moving-imaging) channel 150 (see e.g., FIG. 2), and possibly at least one beam splitter 138 configured to split first channel 182 to deliver corresponding radiation to stationary pattern autofocus module 132 and to stationary image sensor 170 such as a frame camera (in non-limiting embodiments with the former as part of first channel 182). The collection channel 180 also may comprise a beam splitter 134.

In certain embodiments, second (moving-imaging) channel 150 may further comprise a moving-pattern autofocus module 160 (on-the-fly focusing-during-movement module) configured to further derive focusing information from a moving wafer surface 90A (indicated schematically in FIG. 2), which is related to approached metrology targets 91. It is noted that moving-pattern autofocus module 160 may be placed to receive light returned from wafer 90, anywhere in system 100, not necessary as part of second channel 150, e.g., possibly in a separate channel (not shown).

Moving-imaging channel 150 may comprise at least one beam splitter 162 configured to split moving-imaging channel 150 to deliver corresponding radiation to moving-pattern autofocus module 160 and to at least one TDI sensor 154 (in non-limiting embodiments with the former as part of second channel 150). The derived focusing information may be used to provide focus adjustments 135 during stage movement 95 if needed. Moving-pattern autofocus module 160 may be configured to measure and/or adjust the focus position of metrology system 100 according to the greater variation in features and topography of moving wafer surface 90A, with respect to stationary focusing requirements. Moving-pattern autofocus module 160 may be configured to provide continuous feedback on the relative distance between wafer 90 and the sensor head (e.g., objective lens 97), enabling constant correction, so that the new, approached target 91 is in focus when the Move phase (stage movements 95) is complete—providing focused and correctly positioned targets 91 for measurement by stationary-imaging channel 182 without the Acquire stage which is necessary to derive these data in the prior art.

The inventors have found out that most, or even all of the acquisition phase can be eliminated by capturing position and focus information about approached new target 91 while the stage supporting wafer 90 is decelerating 95 at the end of the move phase. This information can be used to make adjustments to the deceleration trajectory of wafer 90 (indicated schematically by arrow 192 in FIGS. 1 and 2), so that when the move phase ends, new target 91 is sufficiently centered within the sensor field of view (of stationary-imaging sensor 170) and sufficiently in focus to allow immediate collection of the target's overlay information.

TDI sensor(s) 154 are configured to collect high-quality images of moving objects, by acquiring charge from light exposure on a column of pixels and transferring the acquired charge to the next column of pixels by a clock pulse, where it continues to accumulate in until the charge is transferred again to the next column. This process continues until the charge reaches the final column of pixels and is subsequently read out of sensor(s) 154. The wafer surface 90A may be moved with respect to sensor(s) 154 along a direction and at a rate that is synchronized with the transfer of accumulated charge between the pixel columns, so that images of wafer surface 90A are accumulated over a longer time frame than would be possible with a simple line scan camera—to decrease the photon noise level in the image and prevent blurring in the recorded image. As discussed above, beam splitter 136 may be placed in collection channel 180 of the sensor head as shown in FIG. 2 to direct a portion of the light collected from wafer 90 to channel 182 for capturing static images and another portion of the light to channel 150 containing TDI sensor 154 for collecting images of moving objects (such as wafer surface 90A).

In certain embodiments, metrology system 100 may further be configured to adjust parameters of wafer positioning movements 95 towards metrology targets 91 from the derived positioning information, to improve a resulting position of metrology targets 91 with respect to objective lens 97 at the end of wafer positioning movement 95, leading to more accurate positioning of targets 91 than in prior art procedures.

First (stationary-imaging) channel 182 and second (moving-imaging) channel 150 may further comprise optical elements configured to optimize acquired images in the respective channels with respect to image sensor 170 and the TDI sensor 154, respectively. For example, each channel may have a dedicated tube lens (e.g., optical elements 172, 152, respectively, or parts thereof, set at appropriate locations along the respective optical paths) so that magnification can be independently optimized for the different pixel sizes and fields of view of the two different types of sensors 170, 154, respectively.

The following calculation provides a non-limiting example for the feasibility of the disclosed systems and methods. Clearly, parameter values may be modified in various embodiments, with respect to specific implementations. To estimate the pixel size, the Nyquist sampling pixel size, $\lambda/(4\ NA$, numerical aperture), is used to yield 140 nm at 0.7 NA and 392 nm wavelength. Assuming 512 pixel wide swaths yield an Optics FOV (field of view) of 0.1 mm for 140 nm pixel and 512×512 TDI (using Optics FOV=square root of [(pixel size·number of pixel columns)$^2$+(pixel size·number of pixel rows)$^2$]. The required stage speed would then equal pixel size·TDI line rate, namely 0.22 m/sec for 140 nm pixel and 1.56 MHz line rate. The relative light requirement may be calculated as (current integration time·TDI line rate/TDI integration stages)·(current pixel size$^2$/TDI pixel size$^2$), yielding 5.8× for 8 msec camera integration, 1.56 MHz line rate, 512 TDI stages, 68 nm current pixel and 140 nm TDI pixel. Therefore, certain embodiments may be realized with current characteristics of spectral bandwidth and illumination NA, using 512 TDI integration stages and using illumination source(s) 110 which is 5.8 brighter than current illumination source. Clearly, other parameters of the system 100 may be modified, or other modifications may be carried out, to adjust to required performance.

Metrology systems 100 and methods 200 disclosed below may comprise any of the following features: (i) Collection of information by the sensor head regarding the location of the next overlay target to be measured, while the wafer stage is in motion; (ii) Use of TDI sensor(s) 154 to collect information about an overlay target's position during stage motion between two targets; (iii) Adjustment of stage motion parameters based on information regarding the location of the next overlay target obtained by the sensor head (e.g., objective lens 97), to facilitate more precise positioning of the target within the sensor field of view at the end of the stage move; and/or (iv) Monitoring and adjustment of the distance between the wafer and the sensor head (e.g., objective lens 97), enabling to complete the move from one overlay target to the next with the new target in specified position and specified focus position (e.g., in focus).

Advantageously, derivation of positioning and possibly focusing information, optionally including stage motion correction as the wafer is underway, provide a reduction of the total time to move to and measure overlay on successive wafer targets by approximately 30% relative to prior art technologies (e.g., the order of magnitude of time required for the acquisition stage in prior art technologies).

Figure 3:
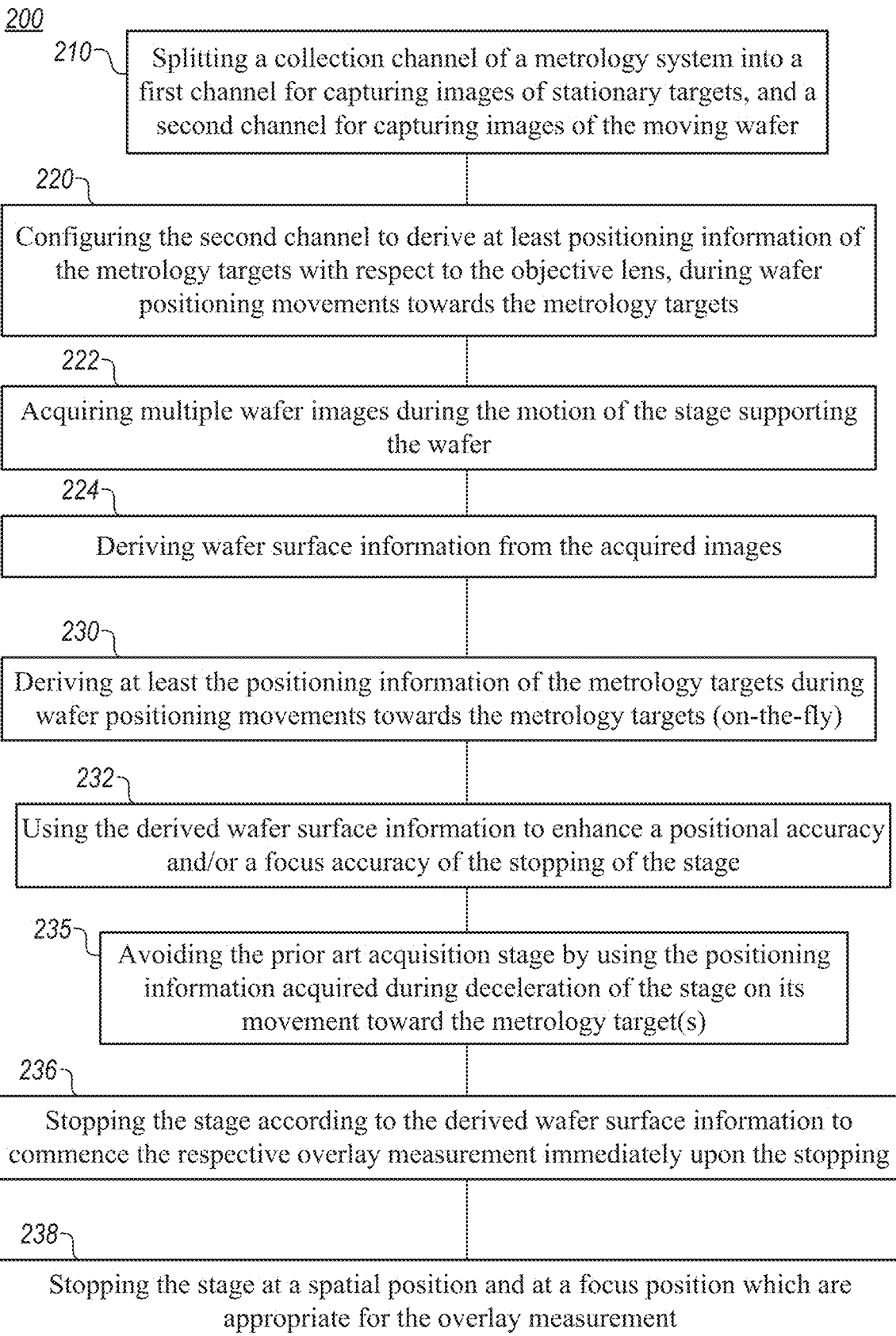
FIG. 3 is a high-level flowchart illustrating a metrology method, according to some embodiments of the invention.
Figure 3:
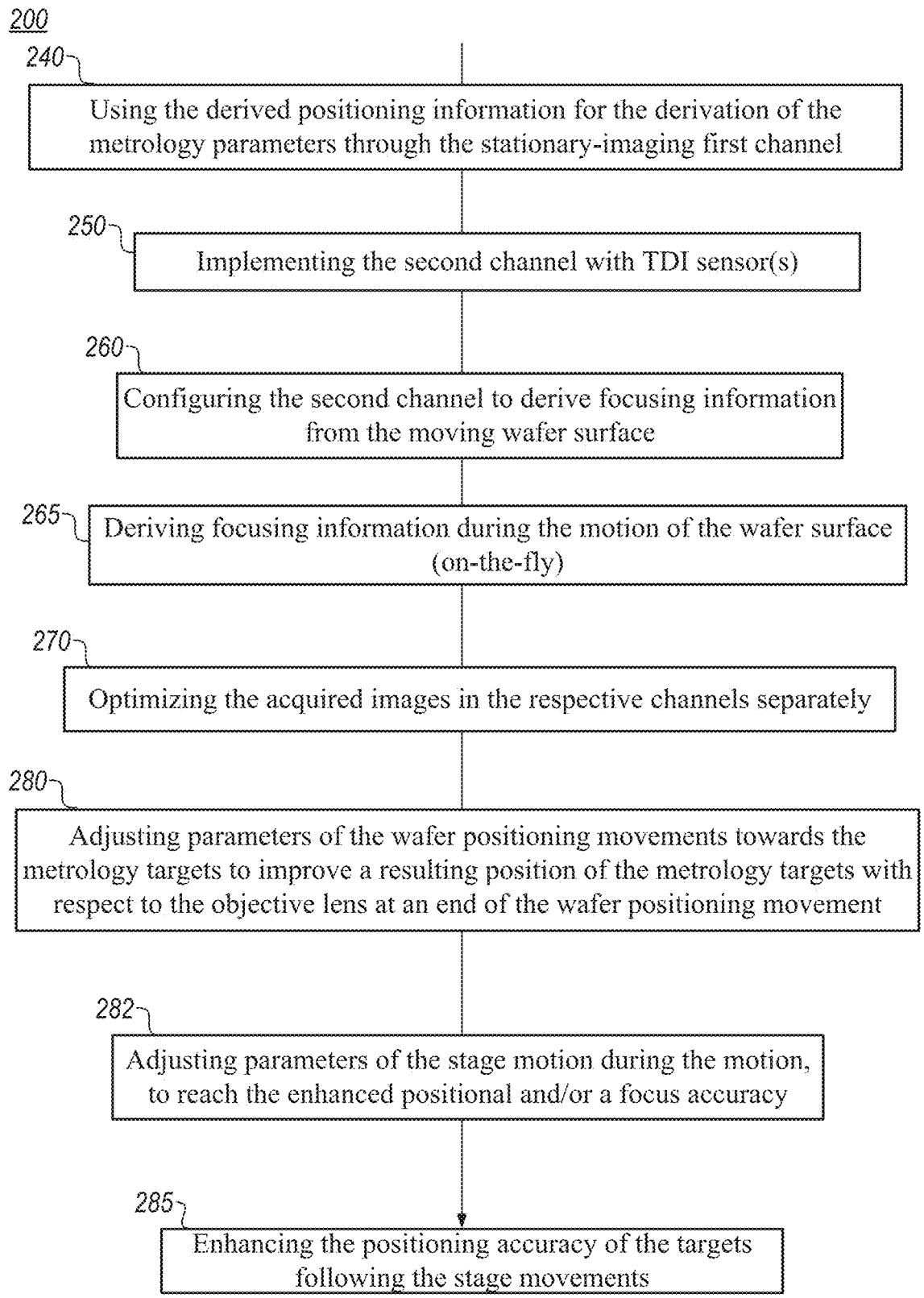

FIG. 3 is a high-level flowchart illustrating a metrology method 200, according to some embodiments of the invention. The method stages may be carried out with respect to systems 100 described above, which may optionally be configured to implement method 200. Method 200 may be at least partially implemented by at least one computer processor, e.g., in a metrology module. Certain embodiments comprise computer program products comprising a computer readable storage medium having computer readable program embodied therewith and configured to carry out the relevant stages of method 200 such as computer readable program configured to derive positioning information of approached metrology targets with respect to an objective lens of a metrology system, during wafer positioning movements towards the metrology targets, and computer readable program configured to use the derived positioning information for conducting metrology measurements of the metrology targets. Certain embodiments comprise metrology positioning information measurements of approached targets derived by embodiments of method 200. Method 200 may comprise the following stages, irrespective of their order.

Metrology method 200 may comprise splitting a collection channel of a metrology system into a first channel for capturing images of stationary targets and a second channel for capturing images of the moving wafer (stage 210), wherein the first, stationary-imaging channel comprises an image sensor configured to derive metrology parameters from corresponding metrology targets on the wafer, and optionally also a stationary pattern autofocus module, and configuring the second, moving-imaging channel to derive at least positioning information of the metrology targets with respect to the objective lens (stage 220), during wafer positioning movements towards the metrology targets, and using the derived positioning information for the derivation of the metrology parameters through the stationary-imaging channel (stage 240).

Metrology method 200 may further comprise deriving at least the positioning information of the metrology targets during wafer positioning movements towards the metrology targets (stage 230), and avoiding the prior art acquisition stage by using the positioning information acquired during deceleration of the stage on its movement toward the metrology target(s) (stage 235).

In certain embodiments, method 200 may comprise in a metrology system which measures overlays on multiple targets on a wafer by moving and stopping a stage supporting the wafer between the measurements of successive targets: acquiring a plurality of wafer images during the motion of the stage (stage 222), deriving wafer surface information from the acquired images (stage 224), and using the derived wafer surface information to enhance a positional accuracy and/or a focus accuracy of the stopping of the stage (stage 232).

Acquiring 222 may be carried out by splitting the collection channel of the metrology system into the first, stationary-imaging channel configured to measure the targets, and the second, moving-imaging channel configured to derive the wafer surface information—e.g., as disclosed for system 100 described above.

Method 200 may further comprise carrying out the stopping of the stage according to the derived wafer surface information to commence the respective overlay measurement immediately upon the stopping (stage 238). Stopping the stage may be carried out at a position and at a focus position which are appropriate for the overlay measurement.

In metrology systems which measures overlay on multiple targets on a wafer by moving and stopping the wafer between the measurements of successive targets, method 200 may provide the acquisition of wafer images while the stage is in motion and the use of information from these images to improve the precision of the stopping position of the stage so that less or no position correction, either optical or mechanical, is required prior to commencing the overlay measurement of each target. Alternatively or complementarily, method 200 may provide the acquisition of wafer focus information while the stage is in motion and use of this focus information to improve the wafer focus when the stage completes its motion so that less or no focus correction is required prior to commencing the overlay measurement of each target.

Metrology method 200 may further comprise implementing the moving-imaging channel with at least one TDI sensor (stage 250), e.g., as disclosed for system 100 described above.

Metrology method 200 may further comprise configuring the second, moving-imaging channel to derive focusing information from the moving wafer surface (stage 260), which is related to the approached metrology targets and/or deriving focusing information during the motion of the wafer surface (stage 265).

Metrology method 200 may further comprise optimizing the acquired images in the respective channels with respect to the image sensor and the TDI sensor, respectively (stage 270). The optimization may be carried out separately for the two channels, with respect to imaging parameters such as focus and dose, and with respect to the different capturing characteristics of the image sensor and the TDI sensor.

Metrology method 200 may further comprise adjusting parameters of the wafer positioning movements towards the metrology targets to improve a resulting position of the metrology targets with respect to the objective lens at the end of the wafer positioning movement (stage 280), e.g., adjusting parameters of the stage motion during the motion, to reach the enhanced positional and/or a focus accuracy (stage 282)—leading to more accurate positioning of the targets for conducting metrology measurements thereof than in prior art procedures provide (stage 285).

Aspects of the present invention are described above with reference to flowchart illustrations and/or portion diagrams of methods, apparatus (systems) and computer program products according to embodiments of the invention. It will be understood that each portion of the flowchart illustrations and/or portion diagrams, and combinations of portions in the flowchart illustrations and/or portion diagrams, can be implemented by computer program instructions. These computer program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or portion diagram or portions thereof.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or portion diagram or portions thereof.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or portion diagram or portions thereof.

The aforementioned flowchart and diagrams illustrate the architecture, functionality, and operation of possible implementations of systems, methods and computer program products according to various embodiments of the present invention. In this regard, each portion in the flowchart or portion diagrams may represent a module, segment, or portion of code, which comprises one or more executable instructions for implementing the specified logical function(s). It should also be noted that, in some alternative implementations, the functions noted in the portion may occur out of the order noted in the figures. For example, two portions shown in succession may, in fact, be executed substantially concurrently, or the portions may sometimes be executed in the reverse order, depending upon the functionality involved. It will also be noted that each portion of the portion diagrams and/or flowchart illustration, and combinations of portions in the portion diagrams and/or flowchart illustration, can be implemented by special purpose hardware-based systems that perform the specified functions or acts, or combinations of special purpose hardware and computer instructions.

In the above description, an embodiment is an example or implementation of the invention. The various appearances of "one embodiment", "an embodiment", "certain embodiments" or "some embodiments" do not necessarily all refer to the same embodiments. Although various features of the invention may be described in the context of a single embodiment, the features may also be provided separately or in any suitable combination. Conversely, although the invention may be described herein in the context of separate embodiments for clarity, the invention may also be implemented in a single embodiment. Certain embodiments of the invention may include features from different embodiments disclosed above, and certain embodiments may incorporate elements from other embodiments disclosed above. The disclosure of elements of the invention in the context of a specific embodiment is not to be taken as limiting their use in the specific embodiment alone. Furthermore, it is to be understood that the invention can be carried out or practiced in various ways and that the invention can be implemented in certain embodiments other than the ones outlined in the description above.

The invention is not limited to those diagrams or to the corresponding descriptions. For example, flow need not move through each illustrated box or state, or in exactly the same order as illustrated and described. Meanings of technical and scientific terms used herein are to be commonly understood as by one of ordinary skill in the art to which the invention belongs, unless otherwise defined. While the invention has been described with respect to a limited number of embodiments, these should not be construed as limitations on the scope of the invention, but rather as exemplifications of some of the preferred embodiments. Other possible variations, modifications, and applications are also within the scope of the invention. Accordingly, the scope of the invention should not be limited by what has thus far been described, but by the appended claims and their legal equivalents.

What is claimed is:

1. A metrology system comprising an illumination channel and a collection channel with respect to an objective lens set to image wafer targets on a wafer, wherein the collection channel is split into a first channel for capturing images of stationary targets and a second channel for capturing images of the wafer during wafer motion,
   the first channel comprising a stationary-image sensor configured to derive metrology parameters from corresponding metrology targets on the wafer, and
   the second channel comprising at least one time delay and integration (TDI) sensor with an associated analysis unit configured to derive at least positioning information of the metrology targets with respect to the objective lens during wafer positioning movements towards the metrology targets.

2. The metrology system of claim 1, wherein the collection channel comprises at least one beam splitter configured to split the collection channel into the first channel and the second channel, and at least one beam splitter configured to split the collection channel to deliver corresponding radiation to a stationary pattern autofocus module and to the stationary-image sensor.

3. The metrology system of claim 1, wherein the collection channel further comprises a moving-pattern autofocus module configured to further derive focusing information from a moving wafer surface, which is related to the approached metrology targets.

4. The metrology system of claim 3, wherein the collection channel further comprises at least one beam splitter configured to split the collection channel to deliver corresponding radiation to the moving-pattern autofocus module and to the at least one TDI sensor.

5. The metrology system of claim 1, wherein the first channel and the second channel further comprise optical elements configured to optimize acquired images in the respective channels with respect to the stationary-image sensor and the TDI sensor, respectively.

6. The metrology system of claim 1, further configured to adjust parameters of the wafer positioning movements towards the metrology targets from the derived positioning information to improve a resulting position of the metrology targets with respect to the objective lens at an end of the wafer positioning movement.

7. A metrology method comprising:
   splitting a collection channel of a metrology system into a first channel and a second channel, wherein the first channel comprises a stationary-image sensor configured to derive metrology parameters from corresponding metrology targets on a wafer,
   configuring the second channel to derive at least positioning information of the metrology targets with respect to an objective lens of the metrology system during wafer positioning movements towards the metrology targets, and
   using the derived positioning information for the derivation of the metrology parameters.

8. The metrology method of claim 7, further comprising implementing the second channel with at least one time delay and integration (TDI) sensor.

9. The metrology method of claim 8, further comprising optimizing acquired images in the respective channels with respect to the stationary-image sensor and the TDI sensor, respectively.

10. The metrology method of claim 7, further comprising configuring the second channel to derive focusing information from a moving wafer surface, which is related to the approached metrology targets.

11. The metrology method of claim 7, further comprising adjusting parameters of the wafer positioning movements towards the metrology targets to improve a resulting position of the metrology targets with respect to the objective lens at an end of the wafer positioning movement.

12. The metrology method of claim 7, wherein at least the derivation of the positioning information is carried out by at least one computer processor.

13. A metrology module configured to carry out the metrology method of claim 7.

14. Metrology positioning information measurements of approached targets derived by the metrology method of claim 7.

15. A computer program product comprising a non-transitory computer readable storage medium having computer readable program embodied therewith, the computer readable program comprising:
   a computer readable program configured to derive at least positioning information of approached metrology targets with respect to an objective lens of a metrology system during wafer positioning movements towards the metrology targets using images, wherein the images are acquired during motion of a stage comprising splitting a collection channel of the metrology system into a stationary-imaging channel configured to measure targets and a moving-imaging channel configured to derive wafer surface information, and a computer readable program configured to use the derived positioning information for conducting metrology measurements of the metrology targets.

16. A method, in a metrology system which measures overlays on multiple targets on a wafer by moving and stopping a stage supporting the wafer between the measurements of successive targets, comprising:

acquiring a plurality of wafer images during the motion of the stage, wherein acquiring the plurality of wafer images during the motion of the stage comprises splitting a collection channel of the metrology system into a stationary-imaging channel configured to measure the targets and a moving-imaging channel configured to derive the wafer surface information, deriving wafer surface information from the acquired images, and using the derived wafer surface information to enhance a positional accuracy and/or a focus accuracy of the stopping of the stage.

17. The method of claim 16, further comprising carrying out the stopping of the stage according to the derived wafer surface information to commence the respective overlay measurement immediately upon the stopping.

18. The method of claim 17, wherein the stopping of the stage is carried out at a position and at a focus position which are appropriate for the overlay measurement.

19. The method of claim 16, further comprising adjusting parameters of the motion of the stage during the motion of the stage to enhance positional and/or a focus accuracy.

* * * * *